(12) United States Patent
Coldren et al.

(10) Patent No.: US 6,810,064 B1
(45) Date of Patent: Oct. 26, 2004

(54) HEAT SPREADING LAYERS FOR VERTICAL CAVITY SURFACE EMITTING LASERS

(75) Inventors: Larry A. Coldren, Santa Barbara, CA (US); Eric M. Hall, Santa Barbara, CA (US); Shigeru Nakagawa, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 62 days.

(21) Appl. No.: 09/934,791

(22) Filed: Aug. 21, 2001

Related U.S. Application Data

(60) Provisional application No. 60/227,165, filed on Aug. 22, 2000, provisional application No. 60/227,161, filed on Aug. 22, 2000, provisional application No. 60/226,866, filed on Aug. 22, 2000, and provisional application No. 60/262,541, filed on Jan. 16, 2001.

(51) Int. Cl.$^7$ .............................. H01S 3/08; H01S 5/00
(52) U.S. Cl. .......................................... 372/96; 372/46
(58) Field of Search ............................. 372/43, 46, 96, 372/4, 36, 78

(56) References Cited

U.S. PATENT DOCUMENTS

| | | | |
|---|---|---|---|
| 4,829,347 A | | 5/1989 | Cheng et al. |
| 5,245,622 A | | 9/1993 | Jewell et al. |
| 5,408,486 A | * | 4/1995 | Shoji ............................ 372/45 |
| 5,422,901 A | | 6/1995 | Lebby et al. |
| 5,513,204 A | * | 4/1996 | Jayaraman .................... 372/46 |
| 5,596,595 A | * | 1/1997 | Tan et al. ..................... 372/96 |
| 5,693,180 A | | 12/1997 | Furukawa et al. |
| 5,719,891 A | | 2/1998 | Jewell |
| 5,732,103 A | * | 3/1998 | Ramdani et al. .............. 372/96 |
| 5,835,521 A | * | 11/1998 | Ramdani et al. .............. 372/96 |
| 5,914,973 A | * | 6/1999 | Jiang et al. .................... 372/26 |
| 5,936,266 A | * | 8/1999 | Holonyak, Jr. et al. ...... 257/106 |
| 5,985,683 A | | 11/1999 | Jewell |
| 5,985,686 A | * | 11/1999 | Jayaraman .................... 438/32 |
| 5,991,326 A | | 11/1999 | Yuen et al. |
| 6,057,560 A | * | 5/2000 | Uchida ......................... 257/94 |
| 6,084,898 A | * | 7/2000 | Heffernan et al. ............ 372/45 |
| 6,121,068 A | * | 9/2000 | Ramdani et al. .............. 438/39 |
| 6,277,696 B1 | * | 8/2001 | Carey et al. ................. 438/289 |
| 6,304,588 B1 | * | 10/2001 | Chua et al. ................... 372/46 |
| 6,392,256 B1 | * | 5/2002 | Scott et al. ................. 257/184 |
| 6,396,864 B1 | * | 5/2002 | O'Brien et al. ............... 372/49 |
| 6,594,294 B1 | * | 7/2003 | Tsao et al. .................... 372/43 |

OTHER PUBLICATIONS

C. Starck, "Long Wavelength VCSEL with Tunnel Junction and Metamorphic AlAs/GaAs Conductive DBR", LEOS '99: IEEE Lasers and Electro–Optics Society 1999 12$^{th}$ Annual Meeting, Nov. 1999, vol. 1, pp. 139–140, especially Figure 1.

K.D. Choquette et al., "Room Temperature Continuous Wave InGaAsN Quantum Well Vertical–Cavity Lasers Emitting at 1.3 μm", Electronics Letters, Aug. 3, 2000, vol. 36, No. 16, pp. 1388–1390.

\* cited by examiner

*Primary Examiner*—Paul Ip
*Assistant Examiner*—Phillip Nguyen
(74) *Attorney, Agent, or Firm*—Greenberg Traurig LLP; Charles Berman, Esq.

(57) ABSTRACT

A system and a method for reducing the temperature in a vertical-cavity surface-emitting laser (VCSEL) comprising of including at least one heat spreading layer adjecent to one of the reflecting surfaces in a VCSEL. The heat spreading layer has high thermal conductivity allowing heat to bypass said one of the reflecting surfaces, thereby efficiently removing the heat away from the device. This also reduces the serial resistance and the thermal impedance of the VCSEL.

31 Claims, 4 Drawing Sheets

|  | THERMAL CONDUCTIVITY [W/K-CM] | MOBILITY [CM²/V-s] | |
|---|---|---|---|
|  |  | ELECTRON | HOLE |
| InP | 0.68 | 4600 | 150 |
| AlAsSb | 0.04 | 80 |  |
| AlGaAsSb | 0.03 | 700 |  |
| GaAs | 0.45 | 8500 | 400 |

HEAT SPREADING LAYERS FOR VERTICAL CAVITY SURFACE EMITTING LASERS

CROSS-REFERENCE TO RELATED APPLICATIONS

The contents of this application are related to those provisional applications having Serial Nos. 60/227,165, 60/227,161, and 60/226,866, filed Aug. 22, 2000, and a provisional application having Serial. No. 601262,541, filed Jan. 16, 2001. The contents of these related provisional applications are incorporated herein by reference. The contents of this application are also related to several non-provisional patent applications being filed concurrently herewith. These contents of the non-provisional patent applications are hereby incorporated in full by reference and have the following attorney docket reference numerals: 510015-263, 510015-264, 510015-265, 510015-266, 510015-267, 510015-268, 510015-269, 510015-270, 510015-271, 510015-272

STATEMENT OF GOVERNMENT-SPONSORED RESEARCH

This invention was made with the support of the United States Government under Grant No. MDA972-98-1-0001, awarded by the Department of Defense (DARPA). The Government has certain rights in this invention under 35 U.S.C. §202

BACKGROUND OF THE INVENTION

1. Field of the Invention

The present invention relates to a surface emitting semiconductor laser and a method for manufacturing the same. Especially, the present invention relates to a vertical-cavity surface-emitting semiconductor laser for long wavelengths (i.e., 1.3 to 1.55 µm) to be used as an optical source for a system of optical communication, optical interconnection, optical data-processing, or the like, in the field of optical data-communication or optical data-processing, and also to a method for manufacturing the novel vertical-cavity surface-emitting semiconductor lasers for long wavelengths.

2. General Background

Significant recent progress in the development of vertical-cavity surface-emitting lasers (VCSEL's) emitting at 1.3–1.55 µm is quickly making these light sources a viable option as high-performance components for optical fiber networks. In addition to offering cost advantages through such features as on-wafer testing, VCSEL's also have inherent advantages over edge-emitters such as scalability to two-dimensional arrays. Although many of the best results for these devices have resulted from the wafer-fusion or metamorphic growth of AlGaAs-based distributed Bragg reflector (DBR) mirrors with active regions, there is still considerable interest in the monolithic growth of long-wavelength VCSEL's. Essentially, lattice-matched, highly reflective AsSb-based DBRs eliminate the need for the complicated mirror schemes.

The mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In summary, a VCSEL includes a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region.

SUMMARY OF THE INVENTION

Lattice-matched, highly reflective AsSb-based DBRs eliminate the need for the complicated mirror schemes as mentioned above. Unlike AlGaAs DBRs, which have evolved over several years with many band-engineering schemes to produce electrically-mature mirrors, the AlAsSb/AlGaAsSb DBRs used in these lasers were, unfortunately, more resistive than would be desired. Combined with the poor thermal characteristics of these materials, the resulting high voltage leads to a large temperature rise in the active region which thereby limits the operation in these lasers to pulsed current.

Accordingly, in one embodiment of the present invention, a vertical-cavity surface-emitting laser (VCSEL) having at least one heat spreading layer is used for eliminating high voltage, thereby, allowing room temperature, continuous-wave (CW) operation of the VCSEL. The at least one of the heat spreading layers reduce the VCSEL temperature by allowing the injected current and generated heat to bypass at least one the DBRs which have poor electrical and thermal conductivity.

Accordingly, in another embodiment of the present invention, a vertical-cavity surface-emitting laser (VCSEL) for decreasing threshold current density comprises: (i) a first reflecting surface, (ii) a second reflecting surface, (iii) an active region with a first surface and a second surface, (iv) a first heat spreading layer preferably doped with an n-type material between the first reflecting surface and the first surface of the active region, (v) a second heat spreading layer preferably doped with an n-type material between the second reflecting surface and the second surface of the active region, (vi) an aperture formed by selectively etching the active region to a predetermined ratio of the size of the active region to the size of a DBR. The heat spreading layers reduce the VCSEL temperature by allowing the injected current and generated heat to bypass the reflecting surfaces which have poor electrical and thermal conductivity.

BRIEF DESCRIPTION OF THE DRAWINGS

In order that the manner in which the above-recited advantages and objects of the invention are attained, as well as others which will become apparent, more particular description of the invention briefly summarized above may be had by reference to the specific embodiments thereof that are illustrated in the appended drawings. It is to be understood, however, that the appended drawings illustrate only typical embodiments of the invention and are therefore not to be considered limiting of its scope, for the invention may admit to other equally effective embodiments.

In the drawings.

DETAILED DESCRIPTION OF PREFERRED EMBODIMENTS OF THE INVENTION

Lattice-matched, highly reflective AsSb-based DBRs eliminate the need for the complicated mirror schemes mentioned above, and electrically-pumped AsSb-based VCSELs emitting at 1.55 µm have already been demonstrated [4]. Unlike AlGaAs DBRs, which have evolved over several years with many band-engineering schemes to produce electrically-mature mirrors, the $Al_{a1}Ga_{1-a1}As_xSb_{1-x}/Al_{a2}Ga_{1-a2}As_xSb_{1-x}$ ($a_1>0.9$, $a_2<0.3$) DBRs used in these lasers were, unfortunately, more resistive than would be desired. Combined with the poor thermal characteristics of these materials, the resulting high voltage led to a high temperature rise in the active region which limited operation in these lasers to pulsed current. A small amount of Ga is generally added to the AlAsSb reflecting surfaces so as to stabilize these surfaces chemically, and make them more resistive to degradation without substantially increasing their index of refraction.

Accordingly, the present invention has a new design that has eliminated this high voltage and, therefore, has allowed room temperature, continuous-wave (CW) operation of AsSb-based VCSELs. This new system preferably uses thick InP cladding layers which serve as contact layers and, as a result, avoids conduction through the mirrors. These layers, when the device is properly packaged, additionally act as heat-spreading layers, addressing the thermal issues associated with AsSb-based mirrors.

Figures 1, 2:
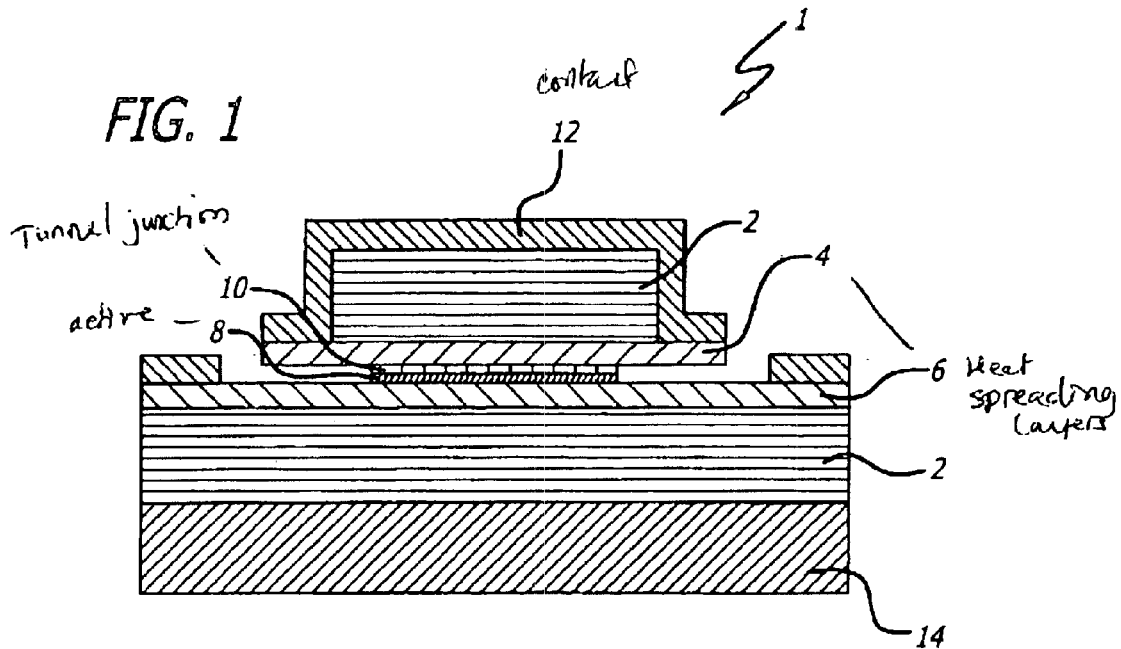
FIG. 1 depicts the VCSEL according to the present invention, depicting the various layers.
FIG. 2 is a table listing the thermal conductivities and the electron/hole mobilities for the various materials considered for the heat spreading layers in the VCSEL.

The design of the VCSEL, as depicted by 1, is shown in FIG. 1. The reflecting surfaces or DBR mirrors 2 are preferably undoped with alternating layers of $Al_{a1}Ga_{1-a1}As_xSb_{1-x}/Al_{a2}Ga_{1-a2}As_xSb_{1-x}$ ($a_1>0.9$, $a_2<0.3$) The lower DBR 2 resides on a substrate 14. The two heat spreading layers 4 and 6 (i.e., the InP layers) are 1–3λ thick and doped n-type with silicon to a level of $5\times10^{17}/cm^3$. The active region 8 is based on an alloy formed of AlGaInAs. Alternateively, the active region 8 may also be based on alloys formed from InGaAsP, or InGaAs material system and contains five strain-compensated quantum wells. A tunnel junction 10 may also be placed at the top InP/AlGaInAs interface, taking advantage of a favorable band-alignment to generate holes for the active region. Preferably, the tunnel junction is formed by the combination of InP and InAlAs based compounds. Holes are created by extraction of electrons from the valence band of the ptype layer in the tunnel junction. This design, therefore, allows two n-type contact layers which have both higher electrical conductivity and lower optical loss than similarly-doped p-type layers. The tunnel junction itself is at a standing-wave null of the cavity mode to minimize the absorption associated with the higher doping at this interface. The injected current is funneled from the outer contacts to the center of the structure below the mirrors by selectively etching the active region, and carriers are spread across the aperture opening by the finite resistance of the tunnel junction.

From a material standpoint, the heat spreading layers may be chosen such that optical reflections from their edges add in phase with reflections from the DBRs.

Bandgap engineering is a well-established technology and has been used to reduce voltage drop across DBRs, but it does not address the reduction of thermal impedance. InP brings a benefit of high thermal conductivity in the Sb-based DBR as a low index material. However, the thermal impedance of this DBR can be expected to reduce only a factor of two, since heat flows through the DBR and AlAsGaSb still dominates the thermal conductivity.

The tunnel junction 10 located between the top reflecting surface, or DBR, and the active region generates holes for the quantum wells and allows the InP layers to be n-type. Only the InP layers and the tunnel junction are doped. This contact scheme enables current to be injected through the InP cladding layers and bypass the Sb-based DBRs, and this eventually reduces series resistance of the VCSELs. This structure also allows heat generated inside the VCSEL to bypass the DBRs in the same manner with the injected current, and most of the heat comes out of the VCSEL through the InP layers and metal contacts. This provides the VCSEL with low thermal impedance in spite of the fairly low thermal conductivity of the Sb-based DBRs. The high electron mobility and the high thermal conductivity of InP eventually lead to low electrical and thermal impedance into the VCSEL and prevent the VCSEL from heating up. FIG. 2 indicates, generally, the mobility and thermal conductivity values for the different materials in the VCSEL.

Figure 3:
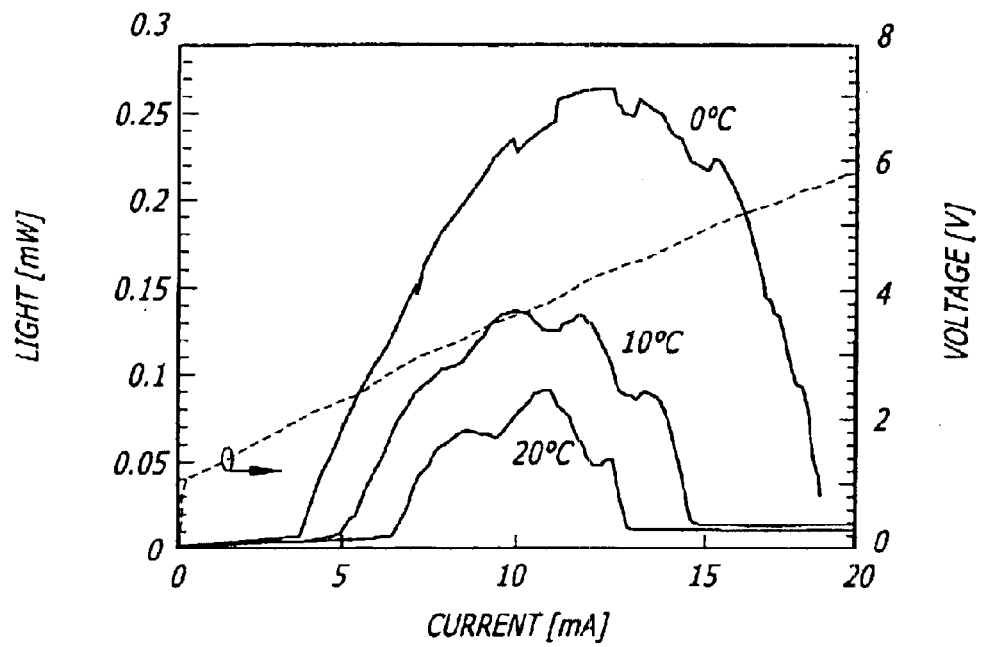
FIG. 3 shows a plot of the CW-operating L-I characteristics of a VCSEL with a 20 µm diameter (as defined by the undercut aperture) as a function of temperature.

The CW-operating L-I characteristics of a VCSEL with a 20 µm diameter (as defined by the undercut aperture) are shown in FIG. 3 as a function of temperature. The small ripples that can be seen in the curves are caused by feedback from the air-substrate boundary, which can be improved by optimizing the antireflective coating. The threshold current is 6.2 mA at 20° C., corresponding to a threshold current density of 1.97 kA/cm². At this temperature, the maximum output power is 100 µW and the differential quantum efficiency is 5.6%. The central lasing wavelength of the devices was 1.555 µm. The high electrical conductivity of n-type InP, which was measured on separate samples to be $6\times10^{-3}$ Ω-cm for the doping level used, leads to a low resistance structure. The I-V characteristics for the device at 20° C. are also shown in FIG. 3. In this embodiment, the VCSEL had a turn-on voltage of 0.9V and a differential resistance of 230Ω.

The lower dissipated powers resulting from these good electrical characteristics directly lead to reduced heating in the devices. Based on a measured thermal impedance of 1.1° C./mW for a 22 µm device and 1.6° C./mW for a 25 µm device from the first generation of AsSb-based VCSELS, the temperature rise in the active region as a function of dissipated power is plotted in FIG. 4.

Figure 4:
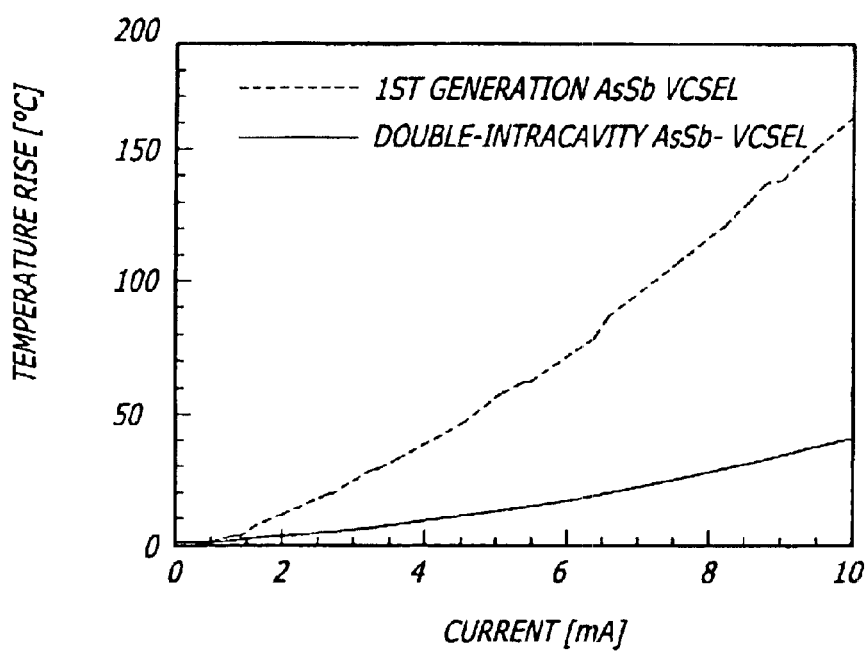
FIG. 4 depicts a plot of the temperature rise in the active region as a function of dissipated power.

As seen from FIG. 4, although the first generation of AsSb-based VCSELs had very low threshold current densities, the high voltage introduced by the un-optimized mirrors led to a large dissipated power and a corresponding large temperature rise in the active region. The temperature rise at threshold, in fact, was over 100° C. For the new design, the temperature rise at threshold is only ~19° C. The thermal impedance values thereby indicate a substantial improvement in the heat management of the devices with the InP contact layers. Further improvements in the thermal impedance are expected, therefore, when these devices are flip-chip bonded to a heat-sinking substrate and heat generated in the active region can be conducted to the heat-sink through the InP layers which have a very high thermal conductivity.

The VCSEL was grown by molecular beam epitaxy in a single step. The top and bottom DBRs 2 used 30.5 periods and 21.5 periods of a first AlGaAsSb layer and a second AlGaAsSb layer respectively. This material combination shows an index contrast of 0.47, which brings a calculated reflectivity of about greater than 99.9% for the top DBR. The measured transmission of the bottom DBR was 1.2%. The 1–3λ thick InP cladding layers 4 and 6 located on top and bottom of the active region were both n-type doped $5 \times 10^{17}$ $cm^{-3}$ with Si, with top surface contact layers 10 nm thick doped $5 \times 10^{18}$ $cm^{-3}$ with Si. InP doped with Si to a level of $5 \times 10^{17}$ $cm^{-3}$ shows an absorption coefficient of 2.5 $cm^{-3}$. The tunnel junction 10 located between the top InP layer and the active region. The n-type layer of the tunnel junction 10 is 20 nm of InP doped $3 \times 10^{19}$ $cm^{-3}$ with Si, and the p-type layer is 20 nm of AlInAs doped $1 \times 10^{20}$ $cm^{-3}$ with C. The active region 8 consists of five strain compensated InAlGaAs QWs. This active region has large conduction band offsets and is promising for high temperature operation.

Figure 5:
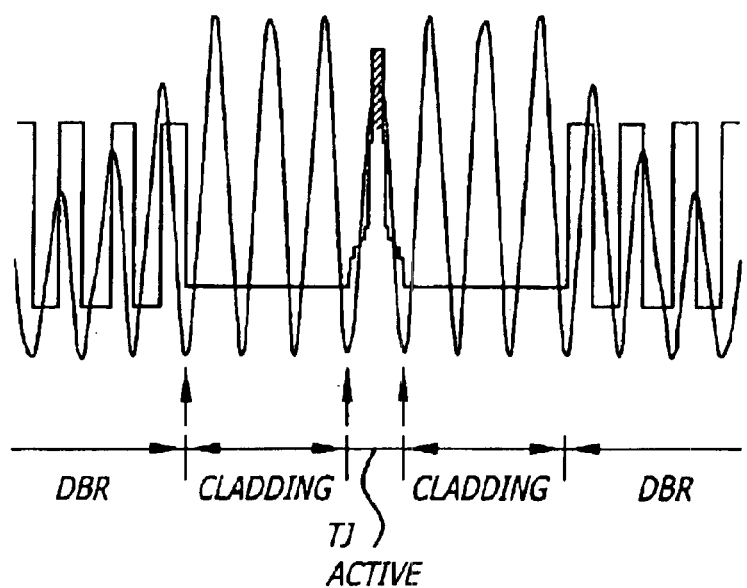
FIG. 5 indicates that the contact layers on the InP cladding and the tunnel junction, are located at standing-wave nulls in the laser cavity, so that free-carrier absorption is reduced as much as possible.

The whole cavity including the active region 8 and the InP cladding layers 4 and 6 is 1–3λ thick. The grown cavity showed a resonance wavelength of 1550 nm, the active region showed photo luminescence peak at 1510 nm, and this gain offset is expected to put the threshold minimum around room temperature. All heavily-doped layers, i.e. the contact layers on the InP cladding and the tunnel junction, are located at standing-wave nulls in the laser cavity, so that free-carrier absorption is reduced as much as possible. This is depicted in FIG. 5.

Exposing the InP contact layers is one of the most critical steps in a fabrication process of the VCSEL. Since the contact layer thickness should be minimized to reduce free carrier absorption in the cavity, various selective etchings were used to control etching depth precisely when the contact layers were exposed. A low-voltage RIE using $Cl_2$ gas etches through the AlGaAsSb-based DBR but does not etch the InP contact layer, so that the etching stops at the very top of the contact layer. This transition is easily identified during the RIE using an in-situ laser monitor. Although the selectivity of AlGaAsSb to InP is not so large (around 6:1), the RIE exposed the very thin (10 nm) top contact layer by combining the selective RIE with the in-situ monitoring. The bottom contact layer (10 nm) was exposed by removing the top InP cladding layer and the thin InAlGaAs-based active region. Two selective etches were used to expose this thin layer. An RIE with $CH_4/H_2/Ar$ gases removes the InP cladding layer but stops at the top InAlAs layer located on top of the active region. Etching of the active region using a mixture of citric acid and hydrogen peroxide exposes the bottom contact layer. This mixture etches the InAlGaAs-based active region but does not etch the InP contact layer with a selectivity of more than 100:1.

Figure 6:
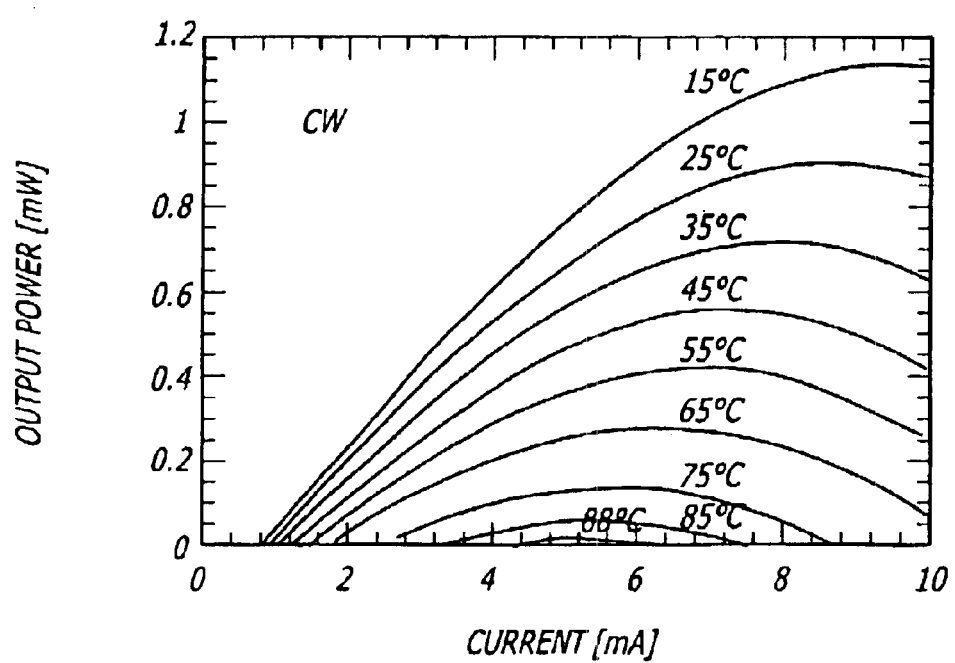
FIG. 6 shows the L-I curves of the VCSEL with a 16 µm etched pillar and an 8 µm undercut aperture under CW operation at various temperatures in the VCSEL.

The L-I characteristics of the VCSELs were measured at various temperatures both under CW and pulsed operation. FIG. 6 shows the L-I curves of the VCSEL with a 16 μm etched pillar and an 8 μm undercut aperture under CW operation at various temperatures. At 25° C., the threshold current and threshold current density are 800 μA and 1.6 $kA/cm^2$, respectively, and the differential quantum efficiency is 23% at maximum. The maximum CW output power is 1.05 mW at 20° C. and 110 μW at 80° C., and the VCSEL operates up to about 88° C.

Excellent results, such as high temperature operation and high output power, as demonstrated by the present invention, are attributed to three primary benefits resulting from the VCSEL structure developed in this work: low operating voltage, low thermal impedance, and low scattering loss.

Figure 7:
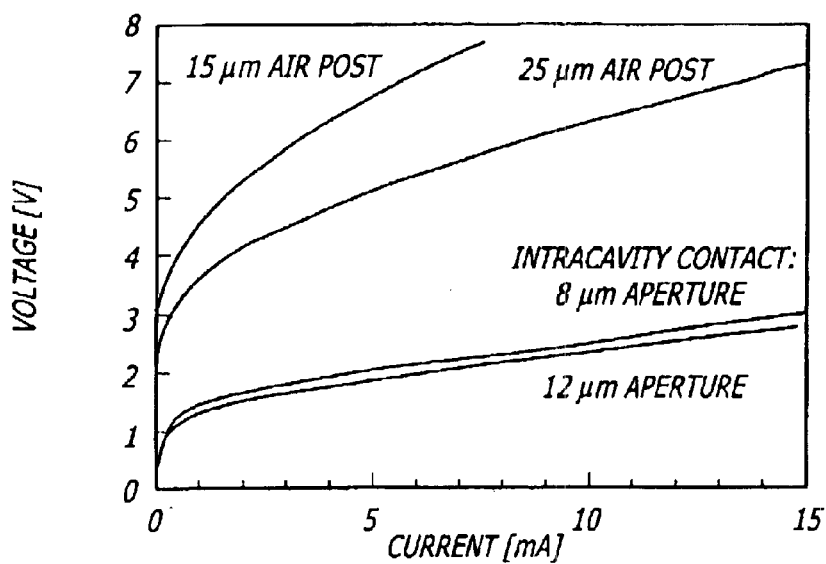
FIG. 7 shows the injected current vs. voltage characteristics for different aperture diameters of the VCSEL.
Figure 8:
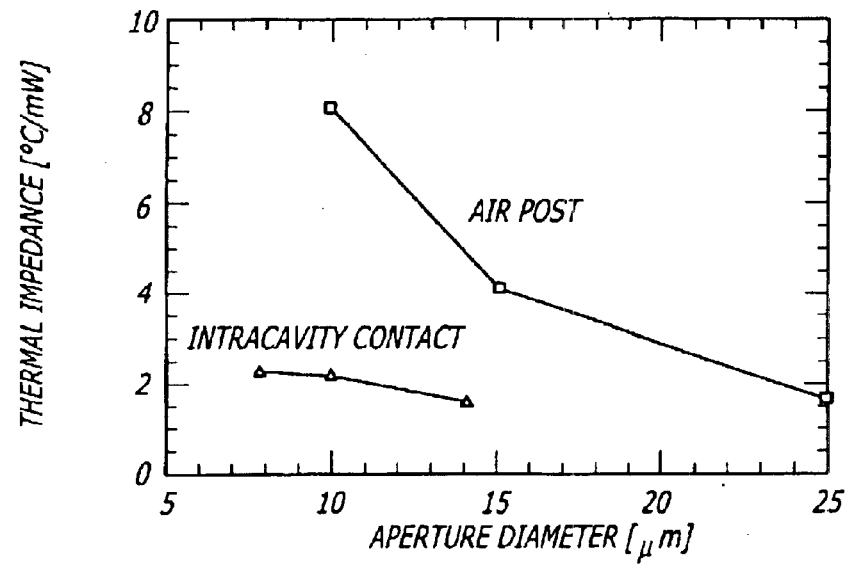
FIG. 8 is a plot of the thermal impedance as a function of aperture diameter of the VCSEL.

Low values of operating voltage and thermal, impedance result from the intracavity-contacted structure with the thick, n-type InP layers. FIG. 7 shows the injected current vs. voltage characteristics for different aperture diameters. FIG. 8 is a plot of the thermal impedance as a function of aperture diameter. Both figures also show the data for the air-post VCSELs, in which current is injected through the Sb-based DBRs. The intracavity contacts provide much lower electrical and thermal impedance compared with the air-post VCSELs. The intracavity-contacted VCSEL with a 16 μm pillar and an 8 μm aperture shows a threshold voltage of 1.4 V and a thermal impedance of 2.2° C./mW, whereas the 15-μm air-post VCSEL shows a threshold voltage of 7.0V and a thermal impedance of 4.1° C./mW. These differences indicate that, in the structure, both the injected current and generated heat bypass the AlAsSb/AlGaAsSb DBRs, which have poor thermal and electrical conductivity.

Figure 9:
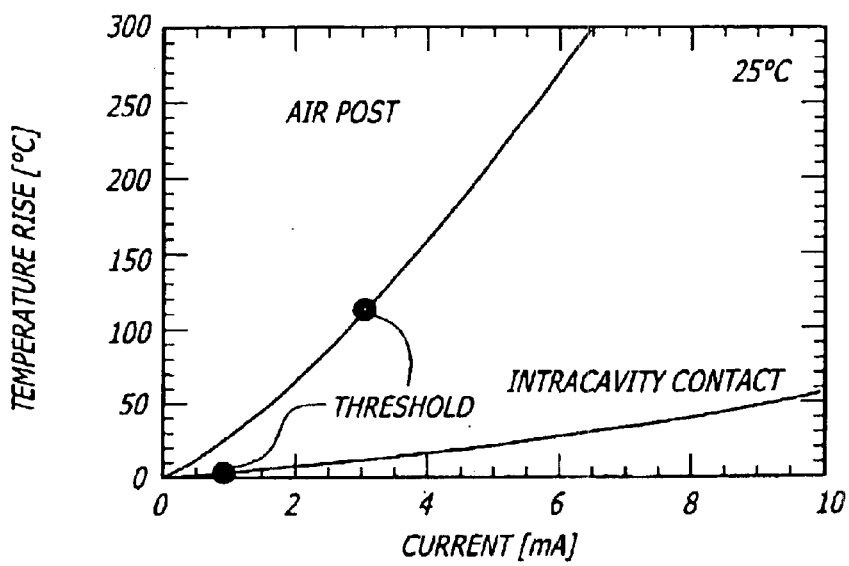
FIG. 9 is a plot showing a comparison in the temperature rise in the VCSEL as a function of the injected current for the air post VCSEL and the intracavity contact VCSEL.

These low values eventually decrease the device temperature, resulting in good thermal properties of the VCSELs. This is depicted in FIG. 9. The temperature rise in the InP intracavity VCSEL is less than 10° C. at threshold, which is much lower than the air-post VCSELs (>100° C.), even though the aperture, which corresponds to a cross section of current and heat paths, is smaller for the VCSEL (8 μm) than for the air-post (15 μm).

Furthermore, the voltage and thermal impedance do not change much with the aperture diameter in the intracavity-contacted structures as can be seen in the air-post structure, and hence the aperture can be made smaller with little increase in the device temperature. Since a vertical flow of the heat or current in the VCSEL depends on cross section of the aperture, less dependence of the voltage and thermal impedance on the aperture size shows that, in the VCSELs, the InP cladding layers work as current and heat spreaders and a lateral flow in the InP cladding layers is dominant for both the injected current and generated heat.

Thus, in a nutshell, the InP layers reduce the device temperature by allowing the injected current and generated heat to bypass the Sb-based quaternary DBR, which has poor electrical and thermal conductivity. This improved VCSEL shows excellent performance, e.g. high output power, low threshold current, and high differential efficiency, under CW operation not only at room temperature but also at high temperatures greater than 80° Celcius.

While the specification describes particular embodiments of the present invention, those of ordinary skill can devise variations of the present invention without departing from the inventive concept. For example, a suitable high thermal conductivity material may be used in place of the InP layers. Alternatively, there could be one or more layers of these high thermal conductivity materials.

We claim the following:

1. A method for reducing the temperature in a vertical-cavity surface-emitting laser (VCSEL), the method comprising:
   forming at least one heat spreading layer between an active layer and at least one reflecting surface in a VCSEL;
   forming at least one metal contact adjacent the at least one heat spreading layer for permitting current to be injected through the at least one heat spreading layer, the current bypassing the at least one reflecting surface; and
   permitting for reduction of the VCSEL temperature by allowing heat to bypass the at least one reflecting surface and pass through the at least one spreading layer, wherein the at least one heat spreading layer has a higher thermal conductivity relative to the at least one reflecting surface.

2. The method according to claim 1, including doping the at least one of the heat spreading layers with an n-type material.

3. The method according to claim 2, wherein the doping with the n-type material is effected by an InP compound.

4. The method according to claim 1, further including forming a Distributed Bragg Reflector (DBR) as part of the at least one reflecting surface.

5. The method according to claim 1, further comprising the step of forming a tunnel junction between an apertured active layer and the at least one of the reflecting surfaces.

6. The method according to claim 1, further including an alloy of InAlGaAs, in the active layer, substantially lattice matched to InP.

7. The method according to claim 1, further including an alloy of InGaAsP, in the active layer, substantially lattice matched to InP.

8. The method according to claim 1, further including an alloy of InGaAs, in the active layer, substantially lattice matched to InP.

9. The method according to claim 4, further including alternating layers of $Al_{a1}Ga_{1-a1}As_b b_{1-b}$ and $Al_{a2}Ga_{1-a2}As_b Sb_{1-b}$ in the DBR.

10. The method according to claim 9, further including the step of assigning b greater than about 0.5, a1 greater than about 0.9, and a2 less than about 0.3.

11. The method according to claim 4, further including an undoped DBR.

12. The method according to claim 1, wherein the VCSEL exhibits continuous wave operation at temperatures greater than about 80 degrees Celsius.

13. The method according to claim 5, further including an n-type InP and p-type InAlAs in the tunnel junction.

14. The method according to claim 1, further providing a thickness of about 1–3 times the optical wavelength to the at least one heat spreading layer.

15. A method for reducing the thermal impedance in a vertical-cavity suffice-emitting laser (VCSEL), the method comprising:
   forming a first thermally conductive InP heat spreading layer between a first reflecting surface and an active layer in a VCSEL;
   forming a second thermally conductive InP heat spreading layer between a second reflecting surface and the active layer in a VCSEL;
   forming at least one metal contact adjacent the first thermally conductive InP heat spreading layer for permitting current to be injected through the at least one InP heat spreading layer, the current bypassing the first reflecting surface; and
   said first and second heat spreading layers reduce the thermal impedance in the VCSEL by allowing the injected current to bypass the reflecting surfaces, wherein the first and second heat spreading layers have a higher thermal conductivity relative to the first and a second reflecting surfaces.

16. The method according to claim 15, wherein the forming steps include doping the heat spreading layers with an n-type material.

17. The method according to claim 16, including effecting the doping with the n-type material with an InP compound.

18. The method according to claim 15, further including forming a Distributed Bragg Reflectors (DBRs) as pan of the first and the second reflecting surfaces.

19. The method according to claim 15, further comprising the step of forming a tunnel junction between an apertured active layer and the fast reflecting surface.

20. The method according to claim 15, further including an alloy of InAlGaAs, in the active layer, substantially lattice matched to InP.

21. The method according to claim 15, further including an alloy of InGaAsP, in the active layer, substantially lattice matched to InP.

22. The method according to claim 15, further including an alloy of InGaAs, in the active layer, substantially lattice matched to InP.

23. The method according to claim 18, further including alternating layers of $Al_{a1}Ga_{1-a1}As_b Sb_{1-b}$ and $Al_{a2}Ga_{1-a2}As_b Sb_{1-b}$ in the DBR.

24. The method according to claim 23, further including the step of assigning b greater than about 0.5, a1 greater than about 0.9, and a2 less than about 0.3.

25. The method according to claim 18, further including undoped DBRs.

26. The method according to claim 15, wherein the VCSEL exhibits continuous wave operation at temperatures greater than about 80 degrees Celsius.

27. The method according to claim 19, further including an n-type InP and p-type InAlAs in the tunnel junction.

28. The method according to claim 15, further providing a thickness of about 1–3 times the optical wavelength to each of the heat spreading layers.

29. A vertical-cavity surface-emitting laser (VCSEL) operating at a reduced temperature, the VCSEL comprising:
   a first and a second reflecting surfaces in a VCSEL;
   an active layer in the VCSEL;
   a first and a second thermally conductive InP heat spreading layers in the VCSEL, said first heat spreading layer being in between the first reflecting surface and the active layer, and the second heat spreading layer being in between the second reflecting surface and the active layer,
   an at least one metal contact adjacent the first thermally conductive InP heat spreading layer for permitting current to be injected through the at least one InP heat spreading layer, the current bypassing the first reflecting surface; and
   the first and second heat spreading layers allowing heat generated in the VCSEL to bypass the first and second reflecting surfaces due to the higher thermal conductivity of the first and second heat spreading layers relative to the first and a second reflecting surfaces, thereby reducing the temperature of the VCSEL.

30. A method for reducing the thermal impedance in a vertical-cavity surface-emitting laser (VCSEL), the method comprising:

forming a first thermally conducted n-doped InP heat spreading layer between a first reflecting surface and an active layer in a VCSEL;

forming a second thermally conductive n-doped InP heat spreading layer between a second reflecting surface and the active layer in a VCSEL;

forming at least one metal contact adjacent the first thermally conductive InP spreading layer for permitting current to be injected through the at least one InP heat spreading layer, the current bypassing the first reflecting surface; and said first and second heat spreading layers reduce the thermal impendance in the VCSEL by allowing the injected current to bypass the reflecting surfaces, wherein the first and second heat spreading layers have a higher thermal conductivity relative to the first and a second reflecting surfaces.

31. A vertical-cavity surface-emitting laser (VCSEL) operating at a reduced temperature, the VCSEL comprising:

a first and a second reflecting surfaces in a VCSEL;

an active layer in the VCSEL;

a first and a second n-type doped thermally conductive InP heat spreading layers in the VCSEL, said first heat spreading layer being in between the first reflecting surface and the active layer, and the second heat spreading layer being in between the second reflecting surface and the active layer;

an at least one metal contact adjacent the first thermally conductive InP heat spreading layer for permitting current to be injected through the at least one InP heat spreading layer, the current bypassing the first reflecting surface; and the first and second heat spreading layers allowing heat generated in the VCSEL to bypass the first and second reflecting surfaces due to the higher thermal conductivity of the first and second heat spreading layers relative to the first and a second reflecting surfaces, thereby reducing the temperature of the VCSEL.

* * * * *